US007601037B2

(12) United States Patent
Telakowski et al.

(10) Patent No.: US 7,601,037 B2
(45) Date of Patent: Oct. 13, 2009

(54) TERMINAL WITH MULTIPLE WIRE CONNECTION

(75) Inventors: Robert Telakowski, Windsor Locks, CT (US); David A. Dorman, Feeding Hills, MA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 11/972,866

(22) Filed: Jan. 11, 2008

(65) Prior Publication Data

US 2009/0181579 A1 Jul. 16, 2009

(51) Int. Cl.
*H01R 4/10* (2006.01)

(52) U.S. Cl. ....................................... 439/879; 439/880

(58) Field of Classification Search ................. 439/884, 439/885, 888, 418, 404, 941, 676, 880, 879; 174/87

See application file for complete search history.

(56) References Cited

U.S. PATENT DOCUMENTS

| | | | | | |
|---|---|---|---|---|---|
| 3,777,051 | A | * | 12/1973 | Ziegler et al. | 174/94 R |
| 4,174,882 | A | * | 11/1979 | McCartney | 385/71 |
| 4,277,124 | A | | 7/1981 | Loose | |
| 4,283,596 | A | * | 8/1981 | Vidakovits et al. | 174/84 R |
| 4,516,829 | A | * | 5/1985 | Borsuk et al. | 385/78 |
| 4,737,122 | A | * | 4/1988 | Dechelette | 439/418 |
| 4,939,455 | A | | 7/1990 | Tsugawa | |
| 5,097,100 | A | | 3/1992 | Jackson | |
| 5,316,506 | A | * | 5/1994 | Ito | 439/879 |
| 5,584,722 | A | | 12/1996 | Heng | |
| 5,911,594 | A | | 6/1999 | Baker | |
| 5,971,798 | A | | 10/1999 | Hoppe | |
| 6,036,508 | A | | 3/2000 | Anderson | |
| 6,238,235 | B1 | * | 5/2001 | Shavit et al. | 439/419 |
| 6,520,807 | B2 | * | 2/2003 | Winings | 439/676 |
| 6,752,647 | B1 | * | 6/2004 | Lin | 439/412 |
| 6,790,087 | B2 | | 9/2004 | Ho | |
| 7,044,795 | B2 | | 5/2006 | Diep | |
| 7,064,448 | B2 | | 6/2006 | Maier | |
| 7,086,908 | B2 | * | 8/2006 | Fukuzaki et al. | 439/669 |
| 2005/0266720 | A1 | * | 12/2005 | Lin | 439/418 |

* cited by examiner

*Primary Examiner*—Neil Abrams
*Assistant Examiner*—Phuong Nguyen
(74) *Attorney, Agent, or Firm*—Carlson, Gaskey & Olds

(57) ABSTRACT

An electrical connection for securing multiple wires within an interior of an electrical connector barrel includes the use of a spacer which is received within the barrel, and which includes guiding spaces to position the plurality of wires.

5 Claims, 2 Drawing Sheets

TERMINAL WITH MULTIPLE WIRE CONNECTION

BACKGROUND OF THE INVENTION

This application relates to the use of an insert in a terminal to guide and align multiple wires that are to be secured within the terminal.

Wires are utilized in any number of applications in the prior art. In one common application, multiple wires are brought into a barrel or holding area on an electrical terminal lug. The terminal lug may be of the sort having a generally flat surface with an aperture to make a connection to another component. The barrel may be cylindrical, but may also be other shapes.

In the prior art, the multiple wires are each stripped at a forward end, and then moved into the lug of the terminal. The lug may then be crimped to lock the wires in place.

There are challenges with the prior art, in that it is sometimes difficult to move multiple wires into the barrel. Sometimes it is necessary to force the wires into the barrel, and thus the assembly is complex. In addition, it is often the case that un-insulated sections of the wire extend away from the barrel, which is also somewhat undesirable.

SUMMARY OF THE INVENTION

In the disclosed embodiment of this invention, a barrel in a terminal lug receives a spacer which defines spaces to receive portions of multiple wires. The spacer aligns and positions the wires within the barrel, such that assembly is simplified.

These and other features of the present invention can be best understood from the following specification and drawings, the following of which is a brief description.

DETAILED DESCRIPTION OF THE PREFERRED EMBODIMENT

Figure 1:
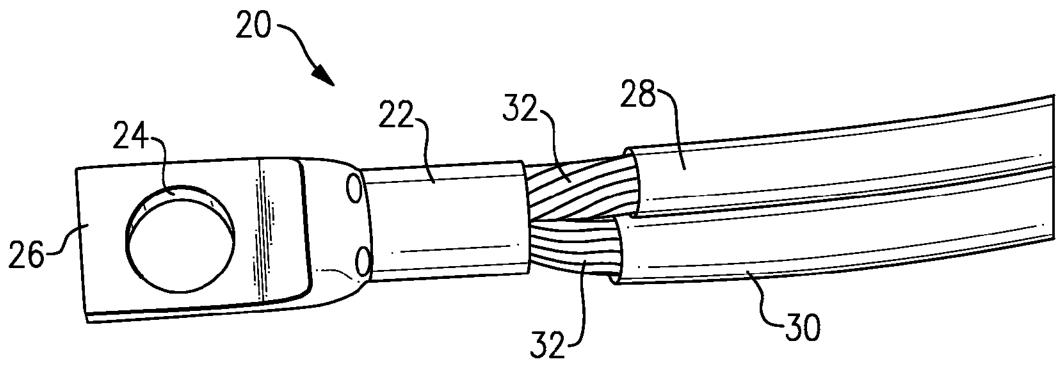
FIG.1 Prior Art
FIG. 1 shows a prior art terminal connection.

FIG. 1 shows a prior art connection 20. Connection 20 includes a barrel 22 extending to a face 26 having an aperture 24. Elements 22, 24, and 26 form an item known as a terminal lug. As known, the aperture 24 is used to make an electrical connection with another component. Multiple wires 28 and 30 have exposed forward portions 32 where insulation has been removed. These forward portions 32 must be forced into the barrel 22. It is necessary that the combined size of the forward portions 32 be approximately the same as the size of the barrel 22 such that when the barrel 22 is crimped, the forward portions 32 are captured. On the other hand, by making the combined forward portions 32 approximately the same size as the lug, it becomes difficult to move the wires into the lug for assembly. In addition, as can be appreciated from FIG. 1, the forward portions 32 extend un-insulated away from the barrel 22, which is undesirable.

Figure 2A:
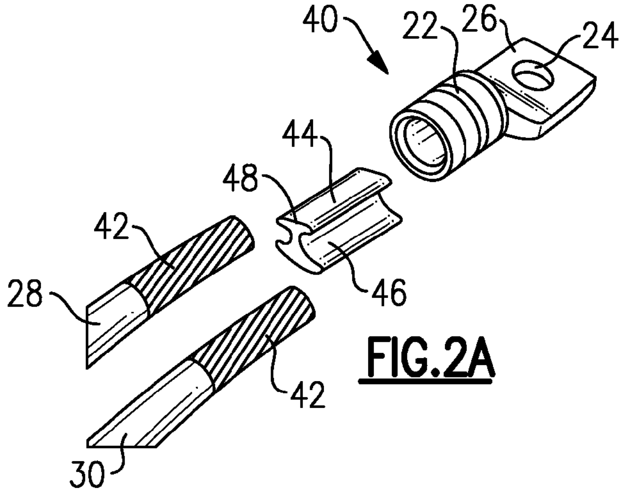
FIG. 2A is an exploded view of the inventive connection.

FIG. 2A shows the inventive connection 40. The terminal lug 22, 26, and 24 is generally as known in the prior art, as are the wires 28 and 30. The forward portions 42 of the wires are moved into an insert 44, and its spaces 46. Separator portions 48 are formed between the guiding spaces 46.

Figure 2B:
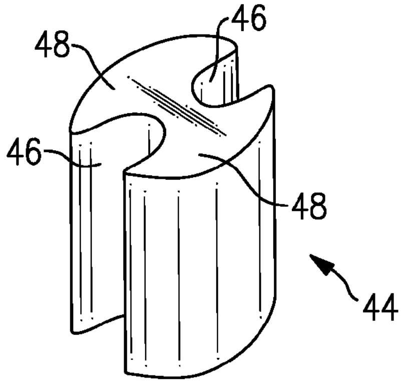
FIG. 2B shows an insert.

As shown in FIG. 2B, the guiding spaces 46 with the separation portions 48 may be generally symmetrical or they may be asymmetric to accommodate varying numbers and sizes of wires. The sizes of the spaces 46, and the portions 48, may be selected to accommodate a particular sized wire, and to be received within a particular sized lug.

Figure 2C:
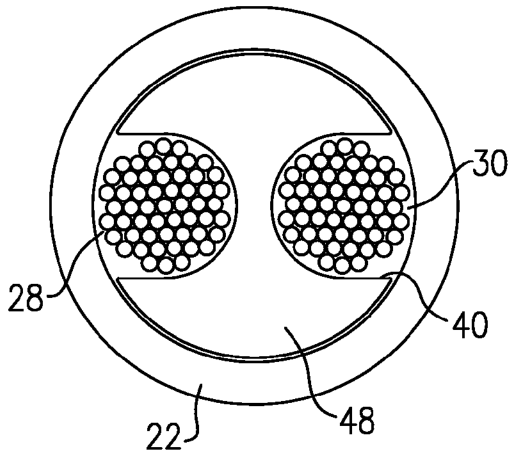
FIG. 2C shows a cross-section through the assembled components.

As shown in FIG. 2C, the components may be easily assembled within the interior of the barrel 22.

Figure 3A:
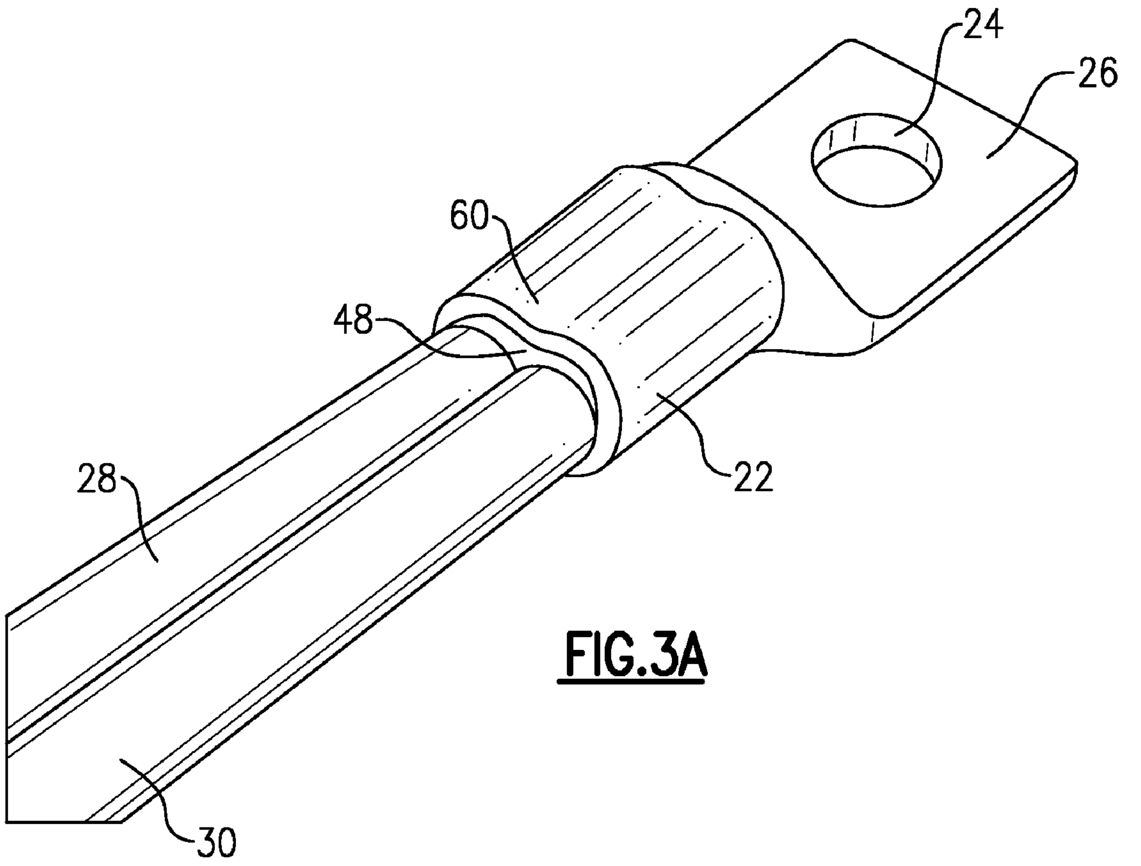
FIG. 3A shows a final step in the connection.
Figure 3B:
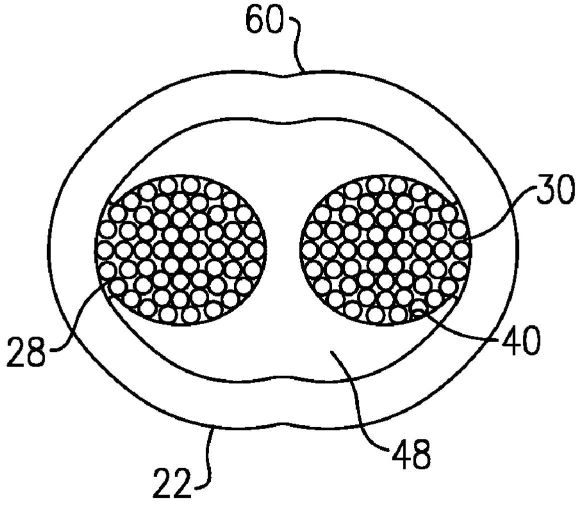
FIG. 3B is a view similar to FIG. 2C, but after the final step has occurred.

As shown in FIG. 3A, the lug may now be crimped to be flattened as shown at 60. As can also be appreciated from FIG. 3B, when the crimping occurs, the insert may deform as well as the barrel 22, and thus the forward portions of the wires 28 and30 are securely captured within the barrel 22. As is clear from FIGS. 2C, 3A, and 3B, the wire 28 is received entirely within one space 40, and the wire 30 entirely in another space 40. The separator portions 48 extend across the entire interior of the barrel 22, and separate the two wires. As is clear from FIG. 3B, after deformation, the barrel 22 is in contact with the space 44 and the spacer and the barrel are both in contact with the wires 28 and 30.

The insert 44 may be formed of copper or other material that provides good conductivity and is also deformable. Since insert44 is formed of a material that has good conductivity, it will provide an electrical connection between the portions of the wires 28 and 30 that are in contact with the spacer, and the interior of the barrel 22.

Of course, more than two wires, and various sized wires, can be utilized. The wires may be of similar sizes, as shown, or different sizes. Also, while crimping is shown as the way the wires are secured, other methods such as brazing or soldering can be used.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. A wire connection comprising:

a barrel extending to an electrical connector, said barrel defining an interior space;

a plurality of wires received within said interior space; and a spacer received within said interior space, said spacer having guiding spaces to receive said plurality of wires within said lug, said spacer being at least partially formed of a material having good conductivity, each of said plurality of wires being received entirely within one of said guiding spaces, and wherein separator portions are defined between said guiding spaces, with said separator portions and said guiding spaces positioning and separating said plurality of wires within said barrel, and said barrel being in contact with said spacer, and said spacer and said barrel being in contact with portions of said plurality of wires, said barrel being deformed after said spacer and said plurality of wires have been inserted into said interior of said barrel to secure said plurality of wires and said spacer within said barrel, and said spacer also being deformed when said barrel is deformed.

2. The wire connection as set forth in claim 1, wherein said spacer defines opposed guiding spaces to receive two wires.

3. The wire connection as set forth in claim 1, wherein said electrical connector is provided by a generally flat face having an aperture to be connected to another component.

4. The wire connection as set forth in claim 1, wherein said spacer is formed of copper.

5. A method of assembling an electrical connection comprising the steps of:

(a) providing a barrel extending to an electrical connector, said barrel defining an interior space to receive a plurality of wires;

(b) positioning a spacer, formed of a material having good conductivity, within said interior space in said barrel, said spacer being provided with guiding spaces to receive a plurality of wires, and inserting said spacer and said plurality of wires into said interior of said barrel with said plurality of wires being received within said guiding spaces, and the insertion of said plurality of wires into said guiding spaces including separating each of said plurality of wires such that it is fully received within one of said guiding spaces; and (c) securing said spacer and said plurality of wires within said barrel by deforming said barrel and said spacer to capture said plurality of wires.

* * * * *